July 31, 1956

J. P. JORDAN ET AL 2,757,323

FULL WAVE ASYMMETRICAL SEMI-CONDUCTOR DEVICES

Filed Feb. 7, 1952

Inventors:
John P. Jordan,
Addison C. Sheckler,
by Merton D. Morse
Their Attorney.

United States Patent Office 2,757,323
Patented July 31, 1956

2,757,323

FULL WAVE ASYMMETRICAL SEMI-CONDUCTOR DEVICES

John P. Jordan, Liverpool, and Addison C. Sheckler, Cato, N. Y., assignors to General Electric Company, a corporation of New York Application February 7, 1952, Serial No. 270,378

3 Claims. (Cl. 317—239)

Figure 1:
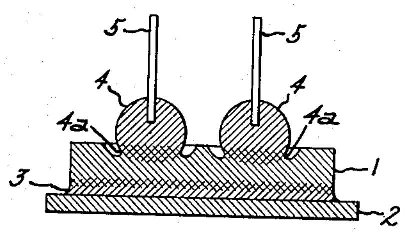

Our invention relates to full wave asymmetrically conductive devices, and more particularly to devices of this character employing semi-conductors such as germanium or silicon.

In copending Hall application, Serial No. 187,478, filed September 29, 1950, and assigned to the assignee of this application is described and claimed an improved asymmetrical conductive device of the semi-conductor type and a method of making such devices. In accordance with the teachings of that application, the donor and acceptor or donor or acceptor impurities are diffused in a controlled manner into a germanium or silicon wafer to provide a P–N or rectifying junction.

As pointed out in the aforementioned Hall application, semi-conductors such as germanium and silicon have become conventionally classified as P-type (positive), N-type (negative) or intrinsic (neither positive nor negative). According to prevailing theory, the class of the semi-conductor is determined primarily by the type and sign of the predominant conduction carriers present in the semi-conductor material. The predominant carriers present are, in turn, determined by the impurity present. The impurities having a significant effect on the character of the conduction carriers have been classified as "donor" and "acceptor" impurities dependent upon their tendency to produce respectively N-type or P-type semi-conductor material. As will be readily understood by those skilled in the art, the donor impurities include such materials as antimony, phosphorous and arsenic, while the acceptor impurities include such materials as aluminum, gallium and indium.

In accordance with the teachings of the Hall application, a rectifying barrier or P–N junction is produced by diffusing into a piece of semi-conductor an impurity belonging to the opposite class from that which would tend to produce the type of germanium involved. That is, for a piece of N-type germanium, an acceptor impurity is diffused into the crystal to provide a P–N junction. For a piece of P-type germanium the rectification barrier is established by diffusing into a particular region of the wafer a quantity of donor impurity.

If the germanium is initially intrinsic, then it is necessary to diffuse into opposed regions a donor and an acceptor impurity. Even in those cases where the initial germanium is P or N type, it is desirable in attaching any conductor to the germanium to use a solder or brazing material which belongs to the proper class of impurities to avoid any interference with the P–N relationship established. For example, if an acceptor impurity is diffused into an N-type wafer to provide a P–N junction with the undiffused impurity providing one terminal of the device, the remote terminal connected to an opposed surface of the wafer should be attached by a material including a donor impurity.

The present invention involves the discovery that by utilization of the techniques described in the aforementioned Hall application it is possible to diffuse into a surface of a semi-conductor wafer at two closely spaced points on one surface of the wafer an impurity selected from one class to provide two independent rectification barriers or P–N junctions so that these junctions may operate in cooperation with a single terminal connected to an opposed surface of the wafer to provide a full wave rectifier. The junctions are sufficiently independent even where the impurity regions are closely spaced so that the resistance between the rectifying paths is the same as would be provided by two independent wafers of the same thickness and depth of diffused impurities. Since the wafers, as usually manufactured and utilized with but a single rectification path are sufficiently large to provide for the two independent junctions in accordance with the present invention, it is seen that a full wave unit may be produced at substantially no greater cost than a single rectification path and accordingly substantial savings are effective without any sacrifice in electrical characteristics of the rectifying unit.

Accordingly, an important object of our invention is to provide a new and improved full wave semi-conductor rectifying device.

It is a still further object of our invention to provide a new and improved diffused impurity type semi-conductor device for use as a full wave rectifier.

Figure 2:
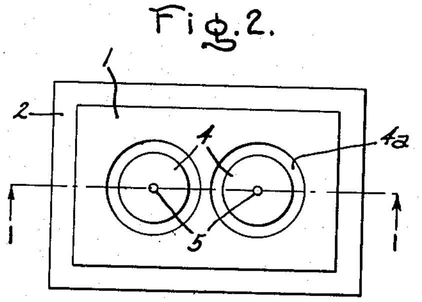
Figure 3:
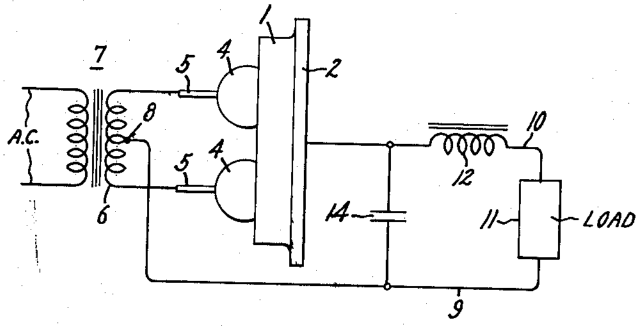

Further objects and advantages will become apparent as the following description proceeds, reference being had to the accompanying drawing and its scope will be pointed out in the appended claims. In the drawing, Fig. 1 is an elevational view in section of a full wave semi-conductor rectifier embodying my invention. Fig. 2 is a plan view of the device of Fig. 1 and Fig. 3 illustrates schematically a full wave rectifier circuit employing the device of Figs. 1 and 2.

Referring now to the drawing, our invention will be described with particular reference to a full wave rectifier assembly utilizing a specific combination of materials although it will be apparent from the foregoing discussion that our invention is applicable generally to semi-conductors and impurities combined in accordance with the teachings of this disclosure.

Referring now to Fig. 1 a full wave rectifier device embodying our invention may be produced by assembling a wafer of N-type germanium 1 on a base plate 2 of suitable material such as fernico with an interposed layer of donor impurity 3 such as antimony. The antimony may be applied as a thin sheet or in the form of powder. Two discrete dots of acceptor impurity, such as indium, are placed on the opposed face of the wafer in reasonably closely spaced relation with the suitable conductors 5 positioned in the dots of acceptor material. This assembly is then subjected to a heat treatment in accordance with the teachings of the above-mentioned Hall application to effect a diffusion of the indium into the germanium to a controlled depth and to bond the base plate 2 to the wafer. The antimony is also diffused into the germanium to a considerable extent. After formation, the junction regions between the indium dots and germanium wafer are etched as illustrated at *4a* either by acid etching or by electrolytic etching as described and claimed in copending Herbert application Serial No. 268,272, filed January 25, 1952, and assigned to the assignee of this invention. The etching process removes the short circuit which is formed in the production of the rectification barriers in accordance with the process described in the aforementioned Hall application.

In accordance with prior art practice, the wafer of semi-conductor material has had a thickness between .01 inch and .04 inch and we have found that with such a wafer the acceptor dots may in some cases be spaced as closely as .01 of an inch and still produce independent P–N junctions. As a commercial practice, however, separations in the order of .025 inch to .125 inch are preferable.

In Fig. 3, we have shown a device constructed in accordance with the above-described method connected in a simple full wave rectifying circuit. The acceptor impurity dots 4 are connected with the end terminals of a mid-tapped secondary winding 6 of an alternating current supply transformer 7. The mid-terminal 8 of the secondary winding provides one side of the direct current output circuit 9 while the other line 10 of the output circuit is connected to the base plate 2. The direct current voltage appearing between conductors 9 and 10 is impressed in a suitable load circuit illustrated at 11 through suitable filter means including a series-connected reactor 12 and shunt capacitor 14.

As the result of the present invention, it is apparent that the full wave rectifier devices of the semi-conductor type are simplified and made cheaper to manufacture. At the same time there is no sacrifice in characteristics as compared with two separate and distinct semi-conductor units connected together and with each donor and acceptor impurity region located on a separate and distinct germanium wafer.

While we have described and claimed the particular embodiments of our invention, it will be apparent to those skilled in the art that changes in modification may be made without departing from the invention in its broader aspects and we aim, therefore, in the appended claims to cover all such changes and modifications as fall within the true spirit and scope of our invention.

What we claim as new and desire to secure by Letters Patent of the United States:

1. A full wave asymmetrical conductive device comprising a wafer of semi-conductor material, a pair of discrete impurity diffused regions on one face of said wafer and providing with said wafer two independent rectification barriers, the impurities being selected from impurity classes including both the donor class and acceptor class but with both impurities selected from the same class, and an electrode connected to an opposed face of said wafer by means including an impurity selected from the other of said classes.

2. A full wave semi-conductor rectifier device comprising a wafer of P-type germanium, an electrode secured to one face by means including an acceptor impurity and a pair of discrete donor impurity diffused regions on the opposed face thereof to provide a pair of independent P–N junctions.

3. A full wave semi-conductor rectifier device comprising a wafer of N-type germanium, an electrode secured to one face by means including a donor impurity and a pair of discrete acceptor impurity diffused regions on the opposed face thereof to provide a pair of independent P–N junctions.

References Cited in the file of this patent

UNITED STATES PATENTS

| | | |
|---|---|---|
| 2,402,661 | Ohl | June 25, 1946 |
| 2,561,411 | Pfann | July 24, 1951 |
| 2,569,347 | Shockley | Sept. 25, 1951 |
| 2,603,693 | Kircher | July 13, 1952 |
| 2,623,102 | Shockley | Dec. 23, 1952 |
| 2,629,672 | Sparks | Feb. 24, 1953 |
| 2,644,852 | Dunlap | July 7, 1953 |
| 2,654,059 | Shockley | Sept. 29, 1953 |